US008929118B2

(12) United States Patent
Oh et al.

(10) Patent No.: US 8,929,118 B2
(45) Date of Patent: Jan. 6, 2015

(54) STACKED MEMORY DEVICE HAVING INTER-CHIP CONNECTION UNIT, MEMORY SYSTEM INCLUDING THE SAME, AND METHOD OF COMPENSATING FOR DELAY TIME OF TRANSMISSION LINE

(75) Inventors: Chi-Sung Oh, Gunpo-si (KR); Jin-Ho Kim, Uiwang-si (KR); Ho-Cheol Lee, Yongin-si (KR); Uk-Song Kang, Seongnam-si (KR); Hoon Lee, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 946 days.

(21) Appl. No.: 13/080,061

(22) Filed: Apr. 5, 2011

(65) Prior Publication Data

US 2011/0249483 A1    Oct. 13, 2011

(30) Foreign Application Priority Data

Apr. 7, 2010    (KR) .......................... 10-2010-0031981

(51) Int. Cl.
*G11C 5/06* (2006.01)
*G11C 5/02* (2006.01)
*G11C 7/10* (2006.01)

(52) U.S. Cl.
CPC .. *G11C 7/10* (2013.01); *G11C 5/02* (2013.01); *G11C 7/1048* (2013.01)
USPC ............................................. 365/63; 365/51

(58) Field of Classification Search
CPC ................................ G11C 7/18; G11C 11/1097
USPC ............................................. 365/63, 51, 194
See application file for complete search history.

(56) References Cited

U.S. PATENT DOCUMENTS

| 5,995,379 | A | 11/1999 | Kyougoku et al. |
|---|---|---|---|
| 6,448,661 | B1 | 9/2002 | Kim et al. |
| 6,649,428 | B2 | 11/2003 | Kai |
| 6,991,964 | B2 | 1/2006 | Matsuo et al. |
| 7,123,497 | B2 | 10/2006 | Matsui et al. |
| 7,352,067 | B2 | 4/2008 | Fukaishi et al. |
| 7,602,630 | B2 | 10/2009 | Janzen |
| 7,679,198 | B2 | 3/2010 | Anderson et al. |
| 7,791,919 | B2 * | 9/2010 | Shimizu .......................... 365/51 |
| 8,456,856 | B2 * | 6/2013 | Lin et al. ....................... 361/783 |
| 2004/0080045 | A1 | 4/2004 | Kimura et al. |
| 2005/0082664 | A1 | 4/2005 | Funaba et al. |
| 2006/0267212 | A1 | 11/2006 | Shibata et al. |
| 2010/0052111 | A1 | 3/2010 | Urakawa |

FOREIGN PATENT DOCUMENTS

| JP | 11-135711 | 5/1999 |
|---|---|---|
| JP | 2002-050735 | 2/2002 |
| JP | 2003-060053 | 2/2003 |
| JP | 2004-152812 | 5/2004 |
| JP | 2006-019328 | 1/2006 |
| JP | 2007-142191 | 6/2007 |
| KR | 10-0298282 | 5/2001 |
| KR | 10-0724653 | 5/2007 |

* cited by examiner

*Primary Examiner* — Son Dinh
(74) *Attorney, Agent, or Firm* — Volentine & Whitt, PLLC

(57) ABSTRACT

A stacked semiconductor memory device is provided which includes a first memory chip including a first transmission line, a second transmission line, and a logic circuit configured to execute a logic operation on a first signal of the first transmission line and a second signal of the second transmission line. The stacked semiconductor memory device further includes a second memory chip stacked over the first memory chip, an inter-chip connection unit electrically coupled between the second memory chip and the first transmission line of the first memory chip, and a dummy inter-chip connection unit electrically coupled to the second transmission line of the first memory chip and electrically isolated from the second memory chip.

23 Claims, 10 Drawing Sheets

STACKED MEMORY DEVICE HAVING INTER-CHIP CONNECTION UNIT, MEMORY SYSTEM INCLUDING THE SAME, AND METHOD OF COMPENSATING FOR DELAY TIME OF TRANSMISSION LINE

CROSS-REFERENCE TO RELATED APPLICATION

A claim of priority under 35 U.S.C. §119 is made to Korean Patent Application No. 10-2010-0031981, filed on Apr. 7, 2010, the disclosure of which is hereby incorporated by reference in its entirety.

BACKGROUND

Embodiments of the inventive concepts generally relate to semiconductor memory devices, and more particularly, to semiconductor memory devices in which two or memory chips are vertically stacked.

The stacking of memory chips within a semiconductor memory device package has been the subject of recent study in an effort to increase memory capacity while maintaining a relative small package foot-print. Herein, these types of devices are referred to as stacked semiconductor memory devices.

Interlayer connection units, such as "through silicon vias" (TSV) are utilized to transmit control and data signals to stacked memory chips of a stacked semiconductor memory device. As a result, signal timing transmission delays can result, for example, between a memory chips receiving signals by way of a TSV and a memory chip receiving signals directly from an external signal terminal. These delays, which can be difficult to precisely measure, may adversely impact the performance of the staked semiconductor memory device.

SUMMARY

In accordance with an aspect of the inventive concepts, a stacked semiconductor memory device is provided which includes a first memory chip including a first transmission line, a second transmission line, and a logic circuit configured to execute a logic operation on a first signal of the first transmission line and a second signal of the second transmission line. The stacked semiconductor memory device further includes a second memory chip stacked over the first memory chip, an inter-chip connection unit electrically coupled between the second memory chip and the first transmission line of the first memory chip, and a dummy inter-chip connection unit electrically coupled to the second transmission line of the first memory chip and electrically isolated from the second memory chip.

In accordance with another aspect of the inventive concepts, a stacked semiconductor memory device is provided which includes a plurality of stacked memory chips each including k lower electrodes, k upper electrodes, and k through silicon vias (TSVs), where k is a positive integer of 2 or more. Respective positions of the k lower electrodes, k upper electrodes and k TSVs are the same within the plurality of stacked memory chips, and a $k^{th}$ upper electrode of a first memory chip among the plurality of stacked memory chips to which a chip selection signal is applied is electrically connected to a $k+1^{th}$ upper electrode of a second memory chip stacked above the first memory chip.

In accordance with still another aspect of the inventive concepts, a stacked semiconductor memory device is provided which includes a plurality of stacked memory chips each including k lower electrodes, k upper electrodes, and k through silicon vias (TSVs), where k is a positive integer of 2 or more. Respective positions of the k lower electrodes, k upper electrodes and k TSVs are the same within the plurality of stacked memory chips, and a $k^{th}$ upper electrode of a first memory chip among the plurality of stacked memory chips to which a chip selection signal is applied is electrically connected to a $k+1^{th}$ upper electrode of a second memory chip stacked above the first memory chip. An upper rightmost electrode of the first memory chip for transmitting the chip selection signal is electrically connected to an upper leftmost electrode of the second memory chip for transmitting the chip selection signal.

In accordance with yet another aspect of the inventive concepts, a memory system is provided which includes a memory controller configured to generate an address signal and a command signal, and a stacked semiconductor memory device configured to store received data and to output stored data in accordance with the address signal and the command signal. The a stacked semiconductor memory device is provided which includes a first memory chip including a first transmission line, a second transmission line, and a logic circuit configured to execute a logic operation on a first signal of the first transmission line and a second signal of the second transmission line. The stacked semiconductor memory device further includes a second memory chip stacked over the first memory chip, an inter-chip connection unit electrically coupled between the second memory chip and the first transmission line of the first memory chip, and a dummy inter-chip connection unit electrically coupled to the second transmission line of the first memory chip and electrically isolated from the second memory chip.

In accordance with another aspect of the inventive concepts, a method of manufacturing a stacked semiconductor memory device is provided. The method includes forming a first transmission line through which a first signal is transmitted, a second transmission line through which a second signal is transmitted, and a logic circuit for comparing the first signal with the second signal on an upper face of a first memory chip. The method further includes stacking a second memory chip above the upper face of the first memory chip, forming an inter-chip connection unit between the first transmission line and an upper face of the second memory chip, and forming a dummy inter-chip connection unit which is electrically coupled to the first memory chip and is electrically isolated from the second memory chip between the second transmission line and the upper face of the second memory chip.

In accordance with yet another aspect of the inventive concepts, a method of compensating for a transmission time difference in a stacked semiconductor memory device is provided. The method includes transmitting a first signal through a first transmission line electrically coupled to an inter-chip connection unit, the inter-chip connection unit coupled between a first memory chip and a second memory chip stacked above the first memory chip and included in the first memory chip. The method further includes electrically coupling a dummy inter-chip connection unit having a same impedance as the inter-chip connection unit to a second transmission line included in the first memory chip, transmitting a second signal through the second transmission line, and comparing the first signal with the second signal.

BRIEF DESCRIPTION OF THE DRAWINGS

The foregoing and other features and advantages of the inventive concepts will become apparent from the detailed description that follows, which reference to the accompanying drawings. Throughout the drawings, like reference characters denote like or similar elements. Further, the drawings are not necessarily to scale, with emphasis instead being placed upon illustrating aspects of the disclosed embodiments for ease of understanding of the inventive concepts. In the drawings.

DETAILED DESCRIPTION OF THE EMBODIMENTS

Figure 1:
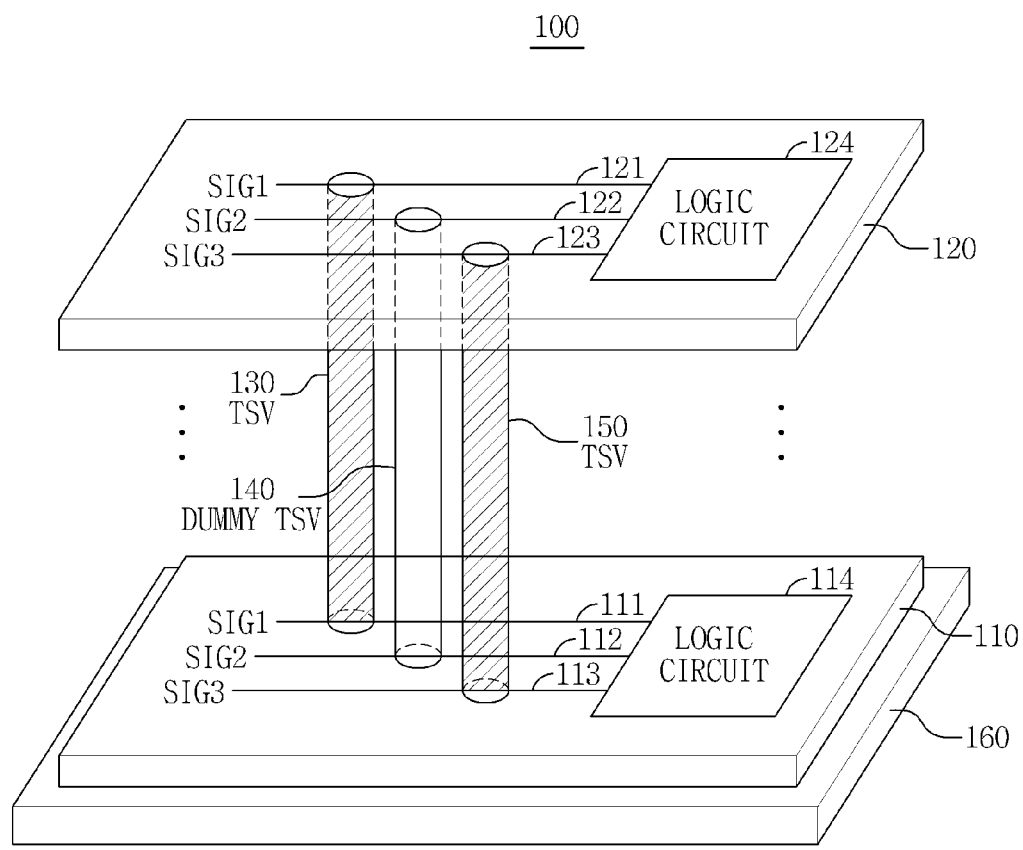
FIG. 1 is a perspective view of a stacked semiconductor memory device in accordance with a first embodiment of the inventive concepts.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Embodiments of the inventive concepts will now be described with reference to the accompanying drawings.

FIG. 1 is a perspective view showing a stacked semiconductor memory device 100 in accordance with a first embodiment of the inventive concepts.

Referring to FIG. 1, the stacked semiconductor memory device 100 of this example includes a first memory chip 110 and a second memory chip 120.

The first memory chip 110 of this example includes a first signal line 111, a second signal line 112, a third signal line 113, and a first logic circuit 114. A first signal SIG1 is transmitted through the first signal line 111, a second signal SIG2 is transmitted through the second signal line 112, and a third signal SIG3 is transmitted through the third signal line 113. The first logic circuit 114 receives the first signal SIG1 through the first signal line 111, receives the second signal SIG2 through the second signal line 112, and conducts a logic operation on the first signal SIG1 and the second signal SIG2. The logic operation of the first logic circuit 114 will be described later herein.

The second memory chip 120 is stacked above an upper face of the first memory chip 110. In this manner, a three-dimensional structure is defined in which the first and second memory chips 110 are vertically stacked relative to a horizontal principal plane of each of the first and second memory chips 110 and 120.

The second memory chip 120 includes a fourth signal line 121, a fifth signal line 122, a sixth signal line 123, and a second logic circuit 124. The first signal SIG1 is transmitted through the fourth signal line 121, the second signal SIG2 is transmitted through the fifth signal line 122, and the third signal SIG3 is transmitted through the sixth signal line 123. The second logic circuit 124 receives the first signal SIG1 through the fourth signal line 121, receives the third signal SIG3 through the sixth signal line 123, and conducts a logic operation on the first signal SIG1 and the third signal SIG3. The logic operation function of the second logic circuit 124 will be described later herein.

A first TSV 130 is coupled between the first signal line 111 formed within the first memory chip 110 and the fourth signal line 121 formed within the second memory chip 120. The TSV 130 of the embodiment constitutes an example of an inter-chip connection unit. However, the inventive concepts are not limited to inter-chip connection units implemented by TSV's.

Since the second signal SIG2 is not used in the second memory chip 120, no TSV is coupled between the second signal line 112 formed within the first memory chip 110 and the fifth signal line 122 formed within the second memory chip 120. Since the third signal SIG3 is used in the second memory chip 120, a second TSV 150 is coupled between the third signal line 113 formed within the first memory chip 110 and the sixth signal line 123 formed within the second memory chip 120.

The stacked semiconductor memory device 100 shown in FIG. 1 may further include a processor chip 160 which communicates with the memory chips 110 and 120. The processor chip 160, for example, exchanges commands and data with the memory chips 110 and 120 stacked above the processor chip 160 through a connection unit (such as one or more bump electrodes) coupled to a memory chip located in a lowest position among the memory chips 110 and 120, that is, to the memory chip 110 located closest to the processor chip 160.

The stacked semiconductor memory device 100 in accordance with the embodiment of the inventive concepts shown in FIG. 1 further includes a dummy TSV 140 having the same impedance as the first TSV 130 coupled between the second signal line 112 formed within the first memory chip 110 and the fifth signal line 122 formed within the second memory chip 120. This is because if the TSV 130 is coupled to the first signal line 111 and no TSV is coupled to the second signal line 112, the first signal line 111 and the second signal line 112 formed within the first memory chip 110 may have different impedances, and accordingly, the first signal SIG1 and the second signal SIG2 may have different arrival times to the first logic circuit 114. The impedance matching of the dummy TSV 140 functions to equalize a transmission time to the first logic circuit of two signals SIG1 and SIG2.

Hereinafter, a dummy inter-chip connection unit (such as a dummy TSV) denotes an inter-chip connection unit (such as a TSV) which extends between memory chips but which is not electrically operatively coupled to at least one of the memory chips.

Figure 2:
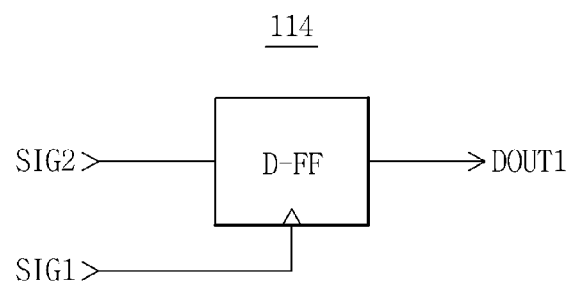
FIG. 2 is a circuit diagram showing an example of a logic circuit included in a first semiconductor chip of the stacked semiconductor memory device shown in FIG. 1.
Figure 3:
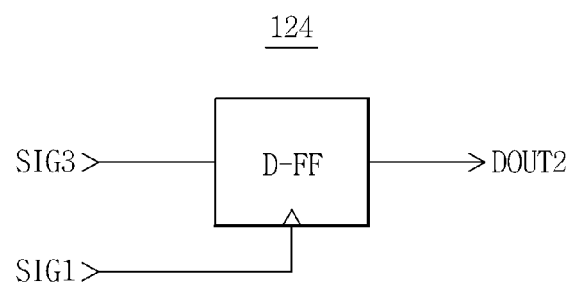
FIG. 3 is a circuit diagram showing an example of a logic circuit included in a second semiconductor chip of the stacked semiconductor memory device shown in FIG. 1.

FIGS. 2 and 3 are circuit diagrams showing examples of logic circuits included in the first semiconductor chip 110 and the second semiconductor chip 120 of the stacked semiconductor memory device shown in FIG. 1.

Referring to the example of FIG. 2, the first logic circuit 114 included in the first semiconductor chip 110 may be a D-type flip-flop (D-FF). In response to the first signal SIG1, the D-FF of FIG. 2 samples the second signal SIG2 and generates a first output signal DOUT1.

Referring to the example of FIG. 3, the second logic circuit 124 included in the second semiconductor chip 120 may also be a D-FF. In response to the first signal SIG1, the D-FF of FIG. 3 samples the third signal SIG3 and generates a second output signal DOUT2.

In the stacked semiconductor memory device 100 in accordance with the embodiment of the inventive concepts shown in FIG. 1, the dummy TSV 140 having the same impedance as the TSV 130 electrically coupled to the first signal line 111 is electrically coupled to the second signal line 112. Accordingly, it is possible to compensate for a transmission time difference between two signals transmitted through the first signal line 111 and the second signal line 112 included in the first semiconductor chip 110. Accordingly, the D-FF shown in FIG. 2 has a relatively high sampling efficiency.

Figure 4:
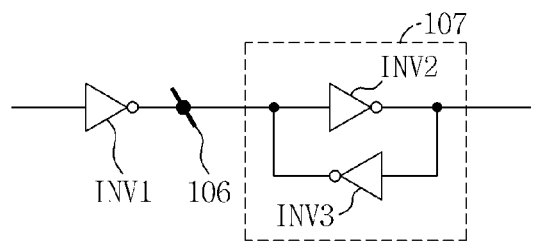
FIG. 4 is a circuit diagram showing an example of a delay module including a TSV used in a semiconductor memory device in accordance with the embodiment of the inventive concepts shown in FIG. 1.

FIG. 4 is a circuit diagram showing an example of a delay module 105 including a TSV used in the semiconductor memory device in accordance with embodiments of the inventive concepts shown in FIG. 1.

The dummy TSV used in embodiments of the inventive concepts may be independently electrically coupled to the transmission line 112. As shown in FIG. 4, an inverter INV1 may be included in a front stage of the dummy TSV 106, and the delay module 105 including a latch circuit 107 in a rear stage thereof may be electrically coupled to the transmission line 112. The latch circuit 107 may include inverters INV2 and INV3.

Figure 5:
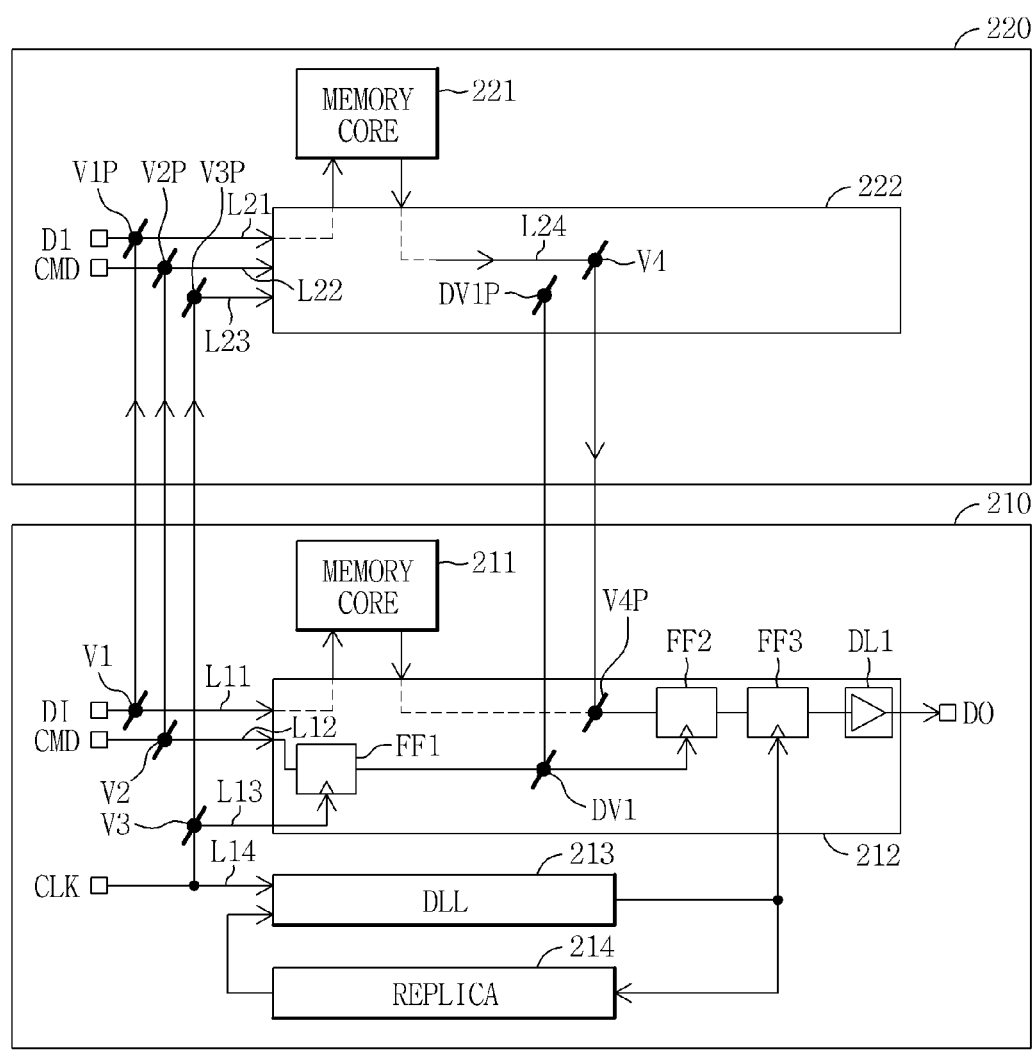
FIG. 5 is a circuit diagram showing a stacked semiconductor memory device in accordance with a second embodiment of the inventive concepts.

FIG. 5 is a circuit diagram showing a stacked semiconductor memory device 200 in accordance with a second embodiment of the inventive concepts.

Referring to FIG. 5, the stacked semiconductor memory device 200 of this example includes a first memory chip 210 and a second memory chip 220. The first memory chip 210 includes a first memory core 211, a first input/output circuit 212, a delay locked loop (DLL) 213, and a replica circuit 214. The second memory chip 220 includes a second memory core 221 and a second input/output circuit 222. The first input/output circuit 212 includes flip-flops FF1, FF2, and FF3 and a delay element DL1.

The stacked semiconductor memory device illustrated in the example of FIG. 5 includes two memory chips 210 and 220, although it will be understood that the stacked semiconductor memory device 200 may instead include three or more memory chips. Also in the example of the stacked semiconductor memory device 200 shown in FIG. 5, the DLL 213 and the replica circuit 214 are included only in the lowermost memory chip 210 of the stack.

Hereinafter, the operation of the stacked semiconductor memory device 200 shown in FIG. 5 will be described.

A clock signal CLK is applied to the first input/output circuit 212 through a line L13, and is applied to the DLL 213 through a line L14. Also, the clock signal CLK is applied to the second input/output circuit 222 of the second memory chip 220 through a TSV (V3-V3P) and a line L23. A command CMD is applied to the first input/output circuit 212 through the line L12, and is applied to the second input/output circuit 222 of the second memory chip 220 through a TSV (V2-V2P) and a line L22. Input data DI is applied to the first input/output circuit 212 of the first memory chip 210 through a line L11, and is applied to the second input/output circuit 222 of the second memory chip 220 through a TSV (V1-V1P) and a line L21.

The first input/output circuit 212 stores the input data DI in the first memory core 211 in response to the clock signal CLK and the command signal CMD, and outputs data stored in the first memory core 211. The replica circuit 214 has a delay time corresponding to a transmission time from an output terminal of the DLL 213 to an internal circuit in which an output signal of the DLL 213 is used. The DLL 213 compares the clock signal CLK to an output signal of the replica circuit 214, and locks the clock signal CLK with the output signal of the replica circuit 214 through an iterative delay operation. The output signal of the DLL 213, that is, a locked internal lock signal, is used in internal circuits located within the memory chip.

The first flip-flop FF1 samples the command signal CMD in response to the clock signal CLK. The second flip-flop FF2 samples and outputs data output from the first memory core 211 and the second memory core 221 in response to an output signal of the first flip-flop FF1. The third flip-flop FF3 samples and outputs an output signal of the second flip-flop FF2 in response to an output signal of the DLL 213. A delay unit DL1 outputs output data DO by delaying an output signal of the third flip-flop FF3.

The second input/output circuit 222 stores the input data DI in the second memory core 221 in response to the clock signal CLK and the command signal CMD, and outputs data stored in the second memory core 221. In the example of this embodiment, the second memory chip 220 does not include a DLL and replica circuit. Also, the second memory chip 220 transmits data stored in the second memory core 221 to the first input/output circuit 212 of the first memory chip 210 through a line L24 and a TSV (V4-V4P). The first input/output circuit 212 outputs data output from the second input/output circuit 222 outside the stacked semiconductor memory device 200 through the second flip-flop FF2, the third flip-flop FF3, and the delay unit DL1.

In FIG. 5, a time delay occurs due to two TSVs in a data read path, that is, a path where a read command CMD is applied to the second input/output circuit 222 and data stored in the second memory core 221 reaches the second flip-flop FF2 of the first input/output circuit 212 through the TSV (V4-V4P). However, a time delay occurs due to one TSV in a path where the read command CMD reaches a clock terminal of the second flip-flop FF2 through the first flip-flop FF1 located within the first input/output circuit 212. Since the delay time is different between the data path and the command path, an error may be generated from the second flip-flop FF2 to sample the data output from the second input/output circuit 222.

In the stacked semiconductor memory device 200 in accordance with embodiments of the inventive concepts shown in FIG. 5, a dummy TSV (DV1-DV1P) having the same impedance as the TSV (V4-V4P) is inserted into a command path connected to the clock terminal of the second flip-flop FF2. Accordingly, in the stacked semiconductor memory device 200, a delay time is compensated for and a sampling error is reduced.

Figure 6:
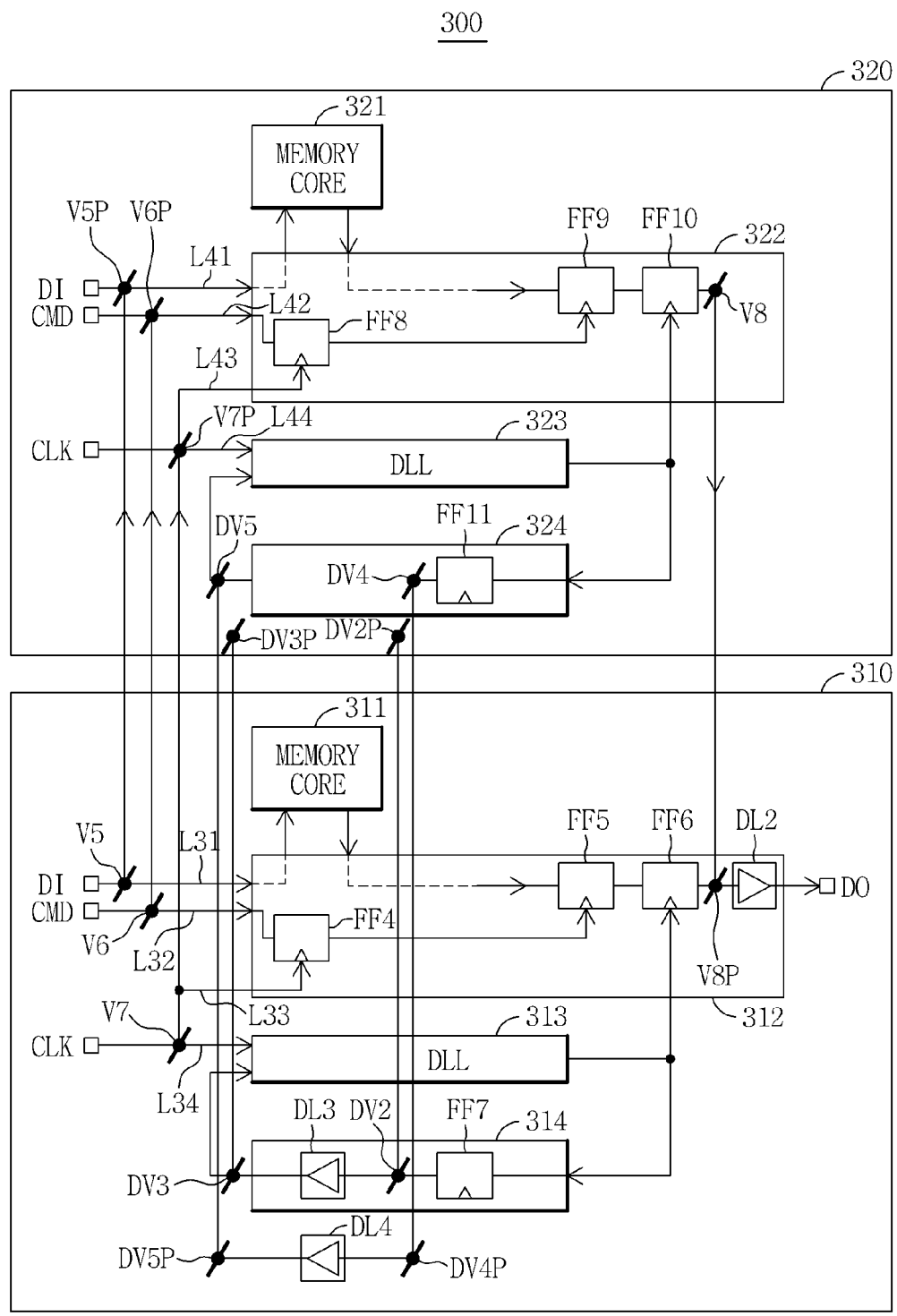
FIG. 6 is a circuit diagram showing a stacked semiconductor memory device in accordance with a third embodiment of the inventive concepts.

FIG. 6 is a circuit diagram showing a stacked semiconductor memory device 300 in accordance with a third embodiment of the inventive concepts.

Referring to FIG. 6, the stacked semiconductor memory device 300 includes a first memory chip 310 and a second memory chip 320. The first memory chip 310 includes a first memory core 311, a first input/output circuit 312, a first DLL 313, and a first replica circuit 314, and the second memory chip 320 includes a second memory core 321, a second input/output circuit 322, a second DLL 323, and a second replica circuit 324. The first input/output circuit 312 includes flip-flops FF4, FF5, and FF6 and a delay element DL2. The second input/output circuit 322 includes flip-flops FF8, FF9, and FF10.

The stacked semiconductor memory device in the example of FIG. 6 includes two memory chips 310 and 320, although it will be understood that the stacked semiconductor memory device 300 may instead include three or more memory chips. Also, in the stacked semiconductor memory device 300 shown in the example of FIG. 6, a DLL and a replica circuit are included in both (or all of) the memory chips 310 and 320 constituting the semiconductor memory device.

Hereinafter, the operation of the stacked semiconductor memory device 300 shown in FIG. 6 will be described.

A clock signal CLK is applied to the first input/output circuit 312 through a line L33, and is applied to the first DLL 313 through a line L34. The clock signal CLK is applied to a second input/output circuit 322 of the second memory chip 320 through a TSV (V7-V7P) and a line L43. A command signal CMD is applied to the first input/output circuit 312 through a line 32, and is applied to the second input/output circuit 322 of the second memory chip 320 through a TSV (V6-V6P) and a line 42. Input data DI is applied to the first input/output circuit 312 of the first memory chip 310 through a line L31, and is applied to the second input/output circuit 322 of the second memory chip 320 through a TSV (V5-V5P) and a line L41.

The first input/output circuit 312 stores the input data DI in the first memory core 311 in response to the clock signal CLK and the command signal CMD, and outputs data stored in the first memory core 311. The replica circuit 314 has a delay time corresponding to a transmission time from an output terminal of the first DLL 313 to an internal circuit in which an output signal of the DLL 313 is used. The first DLL 313 compares the clock signal CLK with an output signal of the replica circuit 314, and locks the clock signal CLK with the output signal of the replica circuit 314 through an iterative delay operation. The output signal of the DLL 313, that is, a locked internal lock signal, is used in internal circuits located within the memory chip.

The first flip-flop FF4 samples the command signal CMD in response to the clock signal CLK. The second flip-flop FF5 samples and outputs data output from the first memory core 311 in response to the output signal of the first flip-flop FF4. The third flip-flop FF6 samples and outputs an output signal of the second flip-flop FF5 in response to the output signal of the first DLL 313. A delay unit DL2 outputs output data DO by delaying an output signal of the third flip-flop FF6.

The second input/output circuit 322 stores input data DI in the second memory core 321 in response to the clock signal CLK and the command signal CMD, and outputs data stored in the second memory core 321. The second replica circuit 324 has a delay time corresponding to a transmission time from an output terminal of the second DLL 323 to an internal circuit in which an output signal of the second DLL 323 is used. The second DLL 313 compares the clock signal CLK with an output signal of the second replica circuit 324, and locks the clock signal CLK with the output signal of the second replica circuit 324 through an iterative delay operation. The output signal of the second DLL 323, that is, a locked internal lock signal, is used in internal circuits located within the memory chip.

The second memory chip 320 transmits data stored in the second memory core 321 to the first input/output circuit 312 of the first memory chip 310 through the sixth flip-flop FF9, the seventh flip-flop FF10, and a TSV (V8-V8P). The first input/output circuit 312 outputs data output from the second input/output circuit 322 outside the stacked semiconductor memory device 300 through the delay unit DL2.

In FIG. 6, a time delay occurs due to the TSV (V8-V8P) in a data read path, that is, a path where a read command CMD is applied to the second input/output circuit 322 and data stored in the second memory core 321 reaches the delay unit DL2 of the first input/output circuit 312 through the TSV (V8-V8P). Accordingly, it is necessary to add a delay time by the TSV (V8-V8P) to a delay time of the first replica circuit 314 constituted by the fourth flip-flop FF7 and a delay unit DL3. As shown in FIG. 6, a dummy TSV (DV2-DV2P) having the same impedance as the TSV (V8-V8P) may be inserted between the fourth flip-flop FF7 and the delay unit DL3.

Likewise, it is necessary to add the delay time by the TSV (V8-V8P) to a delay time of the second replica circuit 324 constituted by the eighth flip-flop FF11 and a delay unit DL4 located in the second memory chip 320. As shown in FIG. 6, a dummy TSV (DV4-DV4P) having the same impedance as the TSV (V8-V8P) may be inserted between the eighth flip-flop FF11 and the delay unit DL4.

As shown in FIG. 6, a delay unit included in the first memory chip 310 located on a lower layer than that of the second memory chip 320 may be used as the delay unit DL4 constituting the second replica circuit 324 included in the second memory chip 320.

A line L34 through which the clock signal CLK is transmitted is electrically connected to a TSV (V7-V7P), and an output signal of the first replica circuit 314 is compared with the clock signal CLK by the first DLL 313. Accordingly, a dummy TSV (DV3-DV3P) of the output terminal of the first replica circuit 314 having the same impedance as the TSV (V7-V7P) may be inserted between the fourth flip-flop FF7 and the delay unit DL3.

Likewise, the output signal of the second replica circuit 324 located in the second memory chip 320 is compared with the clock signal CLK by the second DLL 323. Accordingly, a dummy TSV (DV5-DV5P) of the output terminal of the second replica circuit 324 having the same impedance as the TSV (V7-V7P) may be inserted between the eighth flip-flop FF11 and the delay unit DL4.

The stacked semiconductor memory device 300 in accordance with embodiments of the inventive concepts shown in FIG. 6 compensates for the delay time by inserting a dummy TSV having the same impedance as a TSV located in a data output path into a replica circuit. Accordingly, the DLL included in the stacked semiconductor memory device 300 may generate an accurate internal clock signal.

Figure 7:
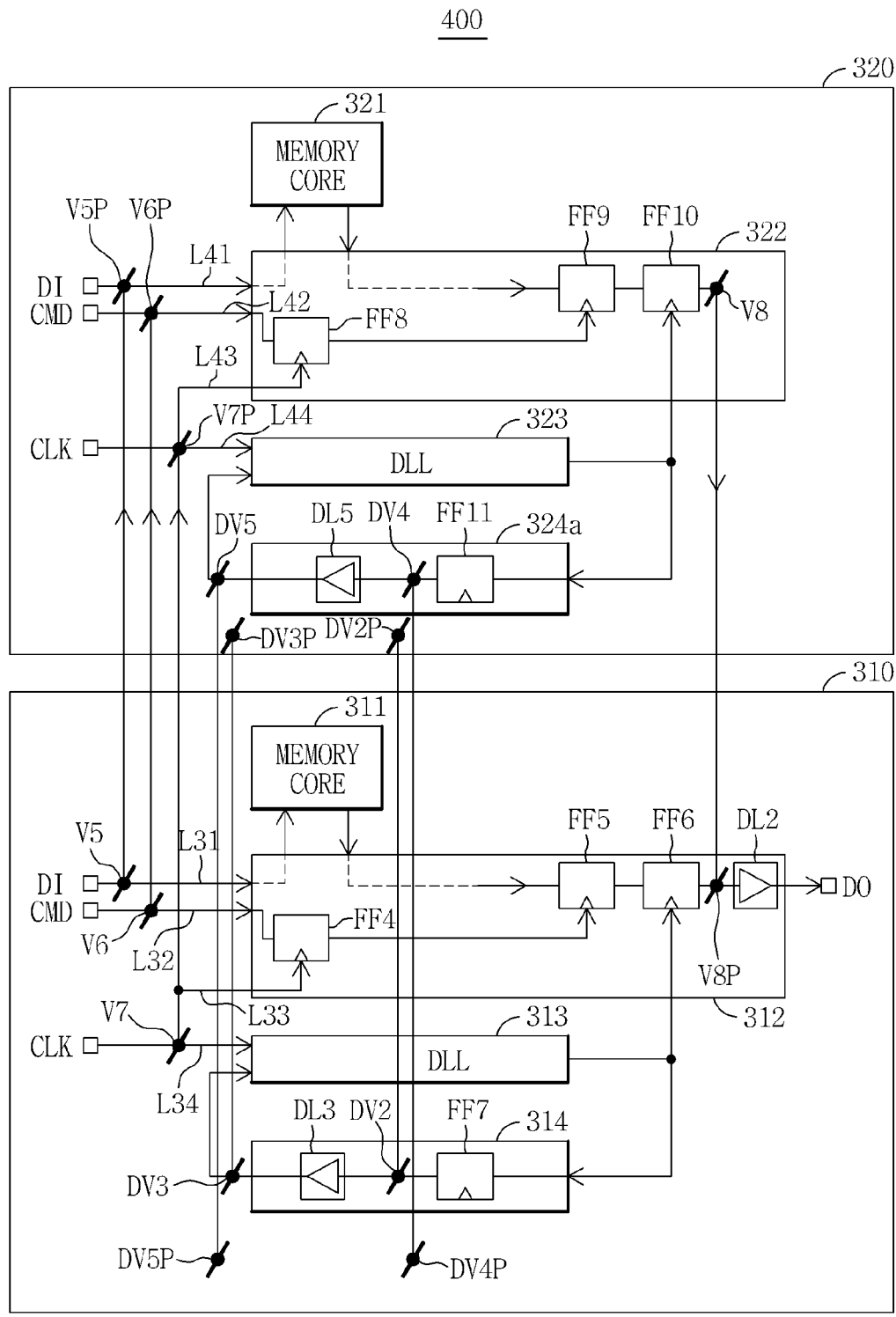
FIG. 7 is a circuit diagram showing a stacked semiconductor memory device in accordance with a fourth embodiment of the inventive concepts.

FIG. 7 is a circuit diagram showing a stacked semiconductor memory device 400 in accordance with a fourth embodiment of the inventive concepts. The stacked semiconductor memory device 400 shown in FIG. 7 differs from the stacked semiconductor memory device 300 shown in FIG. 6 with respect to the second replica circuit 324 located in the second memory chip 320.

In the example of FIG. 6, a delay unit included in the first memory chip 310 is used as the delay unit DL4 constituting the second replica circuit 324 of the second memory chip 320. On the other hand, in the example of FIG. 7, a delay unit included in the second memory chip 320 is used as a delay unit DL5 constituting the second replica circuit 324a of the second memory chip 320, without using the delay unit included in the first memory chip 310.

Figure 8:
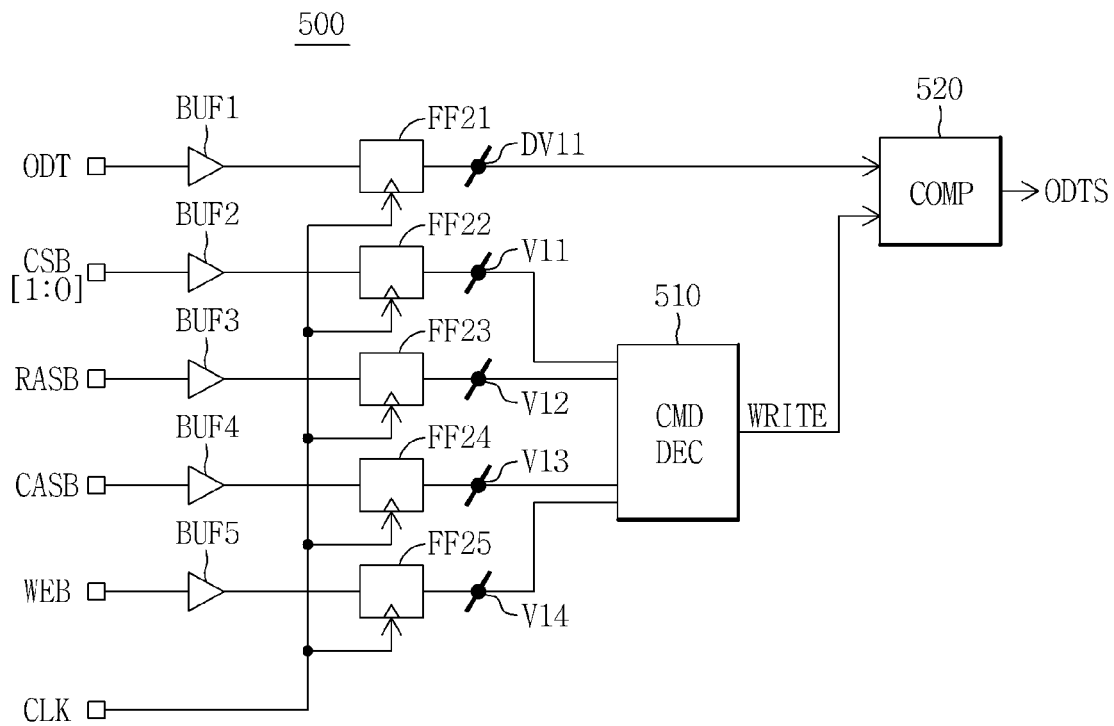
FIG. 8 is a circuit diagram showing a stacked semiconductor memory device in accordance with a fifth embodiment of the inventive concepts.

FIG. 8 is a circuit diagram showing a stacked semiconductor memory device 500 in accordance with a fifth embodiment of the inventive concepts. FIG. 8 is a part of one memory chip constituting a stacked semiconductor memory device including a plurality of memory chips. A memory chip shown in FIG. 8 may be a memory chip in a lowest position among the stacked memory chips.

Referring to FIG. 8, the stacked semiconductor memory device 500 includes buffers BUF1 to BUF5, flip-flops FF21 to FF25, a command decoder 510, and a comparator 520.

An on-die termination signal ODT is buffered by the buffer BUF1, sampled by the flip-flop FF21 in response to a clock signal CLK, and input to the comparator 520. A chip selection signal CSB<1:0> is buffered by the buffer BUF2, sampled by the flip-flop FF22 in response to the clock signal CLK, and input to the command decoder 510. A row address strobe signal RASB is buffered by the buffer BUF3, sampled by the flip-flop FF23 in response to the clock signal CLK, and input to the command decoder 510. A column address strobe signal CASB is buffered by the buffer BUF4, sampled by the flip-flop FF24 in response to the clock signal CLK, and input to the command decoder 510. A write enable signal WEB is buffered by the buffer BUF5, sampled by the flip-flop FF25 in response to the clock signal CLK, and input to the command decoder 510. The command decoder 510 decodes output signals of the flip-flops FF22 to FF25 and generates a write signal WRITE. The comparator 520 generates an internal on-die termination signal ODTS by comparing the output signal of the flip-flop FF21 with the write signal WRITE as the output signal of the command decoder 510.

The stacked semiconductor memory device using a synchronous on-die termination signal ODT generates an internal on-die termination signal ODTS by comparing the on-die termination signal ODT with a write command WRITE.

Command signals CSB, RASB, CASB, WEB, and CLK are transmitted from a memory chip in a lowest position to a memory chip in a highest position through TSVs V11, V12, V13, and V14. The on-die termination signal ODT is related to only a data input/output between an inner portion and an outer portion of the stacked semiconductor memory device, and is not transmitted between the stacked memory chips. Accordingly, a line through which the on-die termination signal ODT is transmitted to the comparator 520 is not coupled to a TSV.

The comparator 520 of one memory chip, for example, the memory chip located on the lowest layer, compares the on-die termination signal ODT with the write signal WRITE generated by decoding the command signals CSB, RASB, CASB, WEB, and CLK. The stacked semiconductor memory device 500 shown in FIG. 8 electrically couples a dummy TSV DV11 having the same impedance as each of the TSVs V11, V12, V13, and V14 to a path in which the on-die termination signal ODT is transmitted.

Accordingly, the stacked semiconductor memory device 500 shown in FIG. 8 may generate the internal on-die termination signal ODTS having an accurate timing.

Figure 9:
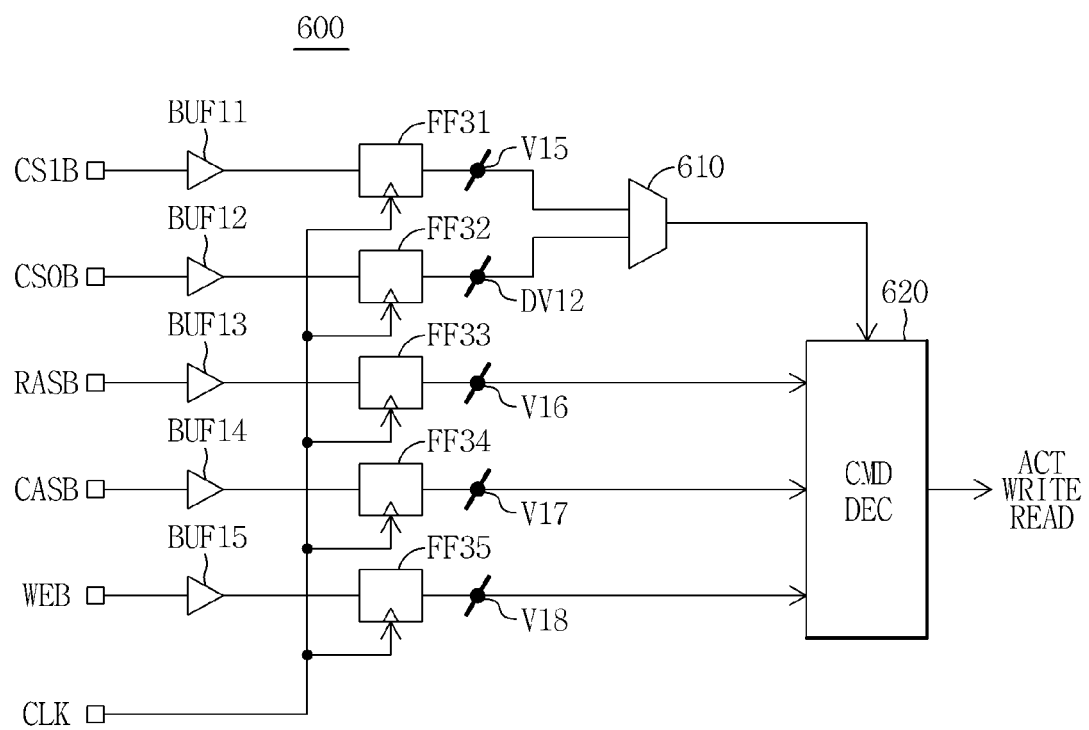
FIG. 9 is a circuit diagram showing a stacked semiconductor memory device in accordance with a sixth embodiment of the inventive concepts.

FIG. 9 is a circuit diagram showing a stacked semiconductor memory device 600 in accordance with a sixth embodiment of the inventive concepts. FIG. 9 shows a part of one memory chip constituting the stacked semiconductor memory device including a plurality of memory chips. The memory chip shown in FIG. 9 may be a memory chip in the lowest position among the stacked memory chips.

Referring to FIG. 9, the stacked semiconductor memory device 600 includes buffers BUF11 to BUF15, flip-flops FF31 to FF35, a multiplexer 610, and a command decoder 620.

A first chip selection signal CS0B is buffered by the buffer BUF11 and sampled by the flip-flop FF31 in response to a clock signal CLK. A second chip selection signal CS1B is buffered by the buffer BUF12 and sampled by the flip-flop FF32 in response to the clock signal CLK. A row address strobe signal RASB is buffered by the buffer BUF13, sampled by the flip-flop FF33 in response to the clock signal CLK, and input to the command decoder 620. A column address strobe signal CASB is buffered by the buffer BUF14, sampled by the flip-flop FF34 in response to the clock signal CLK, and input to the command decoder 620. A write enable signal WEB is buffered by the buffer BUF15, sampled by the flip-flop FF35 in response to the clock signal CLK, and input to the command decoder 620.

The multiplexer 610 selects one of the output signal of the flip-flop FF31 and the output signal of the flip-flop FF32. The command decoder 620 decodes the output signals of the flip-flops FF33, FF34, and FF35 and the output signal of the multiplexer 610, and generates command signals such as an active signal ACTIVE, a write signal WRITE, and a read signal READ to be used in the memory chips.

In the stacked semiconductor memory device having a plurality of ranks, chip selection signals are input from the outside to the memory chip in the lowest position. The chip selection signals are transmitted from the memory chip in the lowest position to the respective memory chips through TSVs. In FIG. 9, the command signals RASB, CASB, and WEB excluding the chip selection signals CS0B and CS1B are transmitted from the memory chip in the lowest position to the memory chip in the highest position through TSVs V16, V17, and V18. The chip selection signal CS0B corresponding to the memory chip located on the lowest layer is used only in the memory chip located on the lowest layer, and the remaining chip selection signals are used in corresponding memory chips. The chip selection signal CS1B is transmitted to a corresponding memory chip through a TSV, but no TSV is electrically coupled to a line through which the chip selection signal CS0B is transmitted.

The command decoder 620 compares the chip selection signal CS0B corresponding to the memory chip located on the lowest layer with the command signals RASB, CASB, and WEB applied through lines electrically coupled to the TSVs V16, V17, and V18. Accordingly, a dummy TSV DV12 having the same impedance as each of the TSVs V16, V17, and V18 is electrically coupled to a path in which the chip selection signal CS0B corresponding to the memory chip located on the lowest layer is transmitted.

Accordingly, the stacked semiconductor memory device 600 shown in FIG. 9 may accurately decode command signals including a chip selection signal from the memory chip located on the lowest layer.

Figure 10:
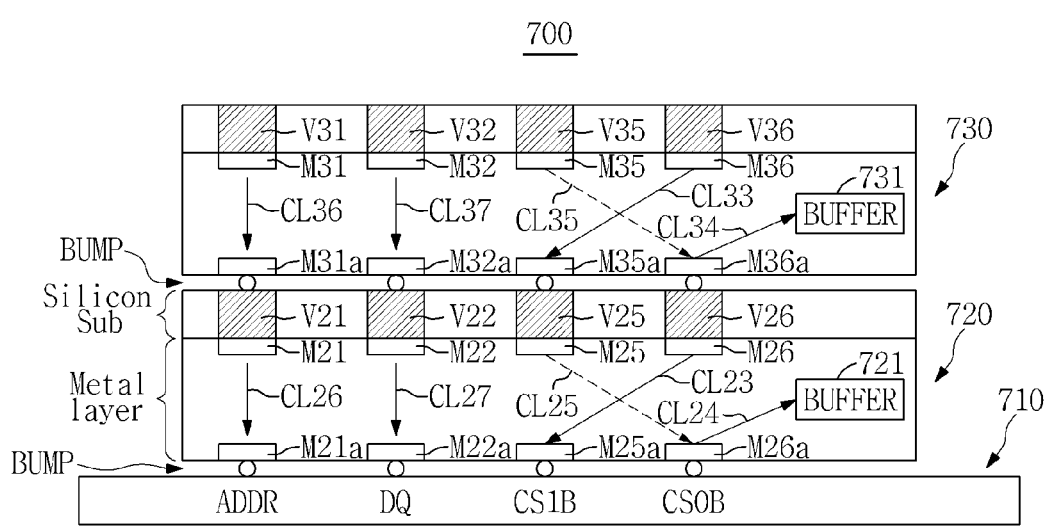
FIG. 10 is a cross-sectional view showing a stacked semiconductor memory device in accordance with a seventh embodiment of the inventive concepts.

FIG. 10 is a cross-sectional view showing a stacked semiconductor memory device 700 in accordance with a seventh embodiment of the inventive concepts.

Referring to FIG. 10, the stacked semiconductor memory device 700 includes a processor chip 710 and memory chips 720 and 730 stacked above the processor chip 710. As shown in FIG. 10, the memory chips 720 and 730 respectively include a silicon substrate and a metal layer. The metal layer includes lower electrodes, upper electrodes, and connection lines. In FIG. 10, the connection lines are indicated by the arrows. In the stacked semiconductor memory device 700, a TSV is formed on the silicon substrate by using a via middle process for a connection between memory chips. When the via middle process is used, the TSV may be formed before the metal layer of memory chips is formed.

TSVs V21, V22, V25, and V26 are located in the silicon substrate of the first memory chip 720. The metal layer of the first memory chip 720 includes lower electrodes M21, M22, M25, and M26, upper electrodes M21a, M22a, M25a, and M26a, and connection lines CL23, CL24, CL25, CL26, and CL27 which respectively electrically connect the lower electrodes M21, M22, M25, and M26 to the upper electrodes M21a, M22a, M25a, and M26a.

TSVs V31, V32, V35, and V36 are located in the silicon substrate of the second memory chip 730. The metal layer of the second memory chip 730 includes lower electrodes M31, M32, M35, and M36, upper electrodes M31a, M32a, M35a, and M36a, and connection lines CL33, CL34, CL35, CL36, and CL37 which respectively electrically connect the lower electrodes M31, M32, M35, and M36 to the upper electrodes M31a, M32a, M35a, and M36a.

Bumps are located between the processor chip 710 and the first memory chip 720 and between the first memory chip 720 and the second memory chip 730. The respective bumps respectively electrically connect semiconductor chips. The lower and upper electrodes respectively included in the memory chips 720 and 730 are electrically connected to respective corresponding pads. Accordingly, the lower and upper electrodes respectively included in the memory chips 720 and 730 may be regarded as the respective corresponding pads.

An address signal ADDR and data DQ are transmitted from the processor chip 710 to the memory chips 720 and 730 through TSVs, lower electrodes, upper electrodes, and connection lines in the same positions of the memory chips 720 and 730.

For example, the address signal ADDR is transmitted from the processor chip 710 to the memory chips 720 and 730 through the upper electrode M21a of the first memory chip 720, the connection line CL26, the lower electrode M21 of the first memory chip 720, the upper electrode M31a of the second memory chip 730, the connection line CL36, and the lower electrode M31 of the second memory chip 730.

The data DQ is transmitted from the processor chip 710 to the memory chips 720 and 730 through the upper electrode M22a of the first memory chip 720, the connection line CL27, the lower electrode M22 of the first memory chip 720, the upper electrode M32a of the second memory chip 730, the connection line CL37, and the lower electrode M32 of the second memory chip 730.

In terms of the chip selection signals CS0B and CS1B, pads of different positions, not the same positions, are electrically connected to each other in the first memory chip 720 and the second memory chip 730.

For example, the second chip selection signal CS1B may be applied to the upper electrode M25a of the first memory chip 720, and the first chip selection signal CS0B may be applied to the upper electrode M26a.

The upper electrode M23a of the first memory chip 720 is electrically connected to the lower electrode M24 of the first memory chip 720 through the connection line CL21, and the lower electrode M24 of the first memory chip 720 is electrically connected to the upper electrode M34a of the second memory chip 730 through the TSV V24 and the bump. The upper electrode M34a of the second memory chip 730 is electrically connected to the lower electrode M35 of the second memory chip 730 through the connection line CL32.

The upper electrode M24a of the first memory chip 720 is electrically connected to the lower electrode M25 of the first memory chip 720 through the connection line CL22, and the lower electrode M25 of the first memory chip 720 is electrically connected to the upper electrode M35a of the second memory chip 730 through the TSV V25 and the bump. The upper electrode M35a of the second memory chip 730 is electrically connected to the lower electrode M36 of the second memory chip 730 through the connection line CL33.

The upper electrode M25a of the first memory chip 720 is electrically connected to the lower electrode M26 of the first memory chip 720 through the connection line CL23, and the lower electrode M26 of the first memory chip 720 is electrically connected to the upper electrode M36a of the second memory chip 730 through the TSV V26 and the bump. The upper electrode M36a of the second memory chip 730 is electrically connected to the input buffer 731 through the connection line CL34.

Accordingly, the second chip selection signal CS1B is applied to the input buffer 731 included in the second memory chip 730 through the upper electrode M25a of the first memory chip 720, the lower electrode M26 of the first memory chip 720, the TSV V26, and the upper electrode M36a of the second memory chip 730. Therefore, the second memory chip 730 may be selected by the second chip selection signal CS1B.

The upper electrode M26a of the first memory chip 720 is electrically connected to the input buffer 721 through the connection line CL24.

Accordingly, the first chip selection signal CS0B is applied to the input buffer 721 included in the first memory chip 720 through the upper electrode M26a of the first memory chip 720. Therefore, the first memory chip 720 may be selected by the first chip selection signal CS0B.

Referring to FIG. 10, the stacked semiconductor memory device 700 may automatically identify stacked memory chips without using a chip identification signal by asymmetrically connecting electrodes located in a path in which a chip selection signal is transmitted between the stacked memory chips as described above. As will be described later, the stacked semiconductor memory device 700 may compensate for a delay time between signals to be compared by matching impedances of transmission lines through which the chip selection signals CS0B, CS1B, CS2B, and CS3B are transmitted.

The stacked semiconductor memory device 700 shown in FIG. 10 matches impedances of chip transmission lines by using unused electrodes and TSVs among electrodes and TSVs prepared for chip selection signal transmission.

The first chip selection signal CS0B is used in the first memory chip 720, and is not used in the second memory chip 730. It is necessary to compensate for a delay time of a path in which the first chip selection signal CS0B is transmitted so as to compare command signals with the first chip selection signal CS0B within the first memory chip 720 without error.

The upper electrode M26a of the first memory chip 720 to which the first chip selection signal CS0B is applied is electrically connected to the connection line CL25, the lower electrode M25 of the first memory chip 720, the TSV V25, the upper electrode M35a of the second memory chip 730, the connection line CL33, the lower electrode M36 of the second memory chip 730, and the TSV V36.

The second chip selection signal CS1B is used in the second memory chip 730. It is necessary to compensate for a delay time of a path in which the second chip selection signal CS1B is transmitted so as to compare command signals with the second chip selection signal CS1B within the second memory chip 730 without error.

The upper electrode M36a of the second memory chip 730 to which the second chip selection signal CS1B is applied is electrically connected to the connection line CL35, the lower electrode M35 of the second memory chip 730, and the TSV V35. When the stacked semiconductor memory device 700 includes the two memory chips 720 and 730 as shown in FIG. 10, it is possible to compare command signals with the second chip selection signal CS1B within the second memory chip 730 without error even though a delay time of a path in which the second chip selection signal CS1B is transmitted is not compensated for.

Figure 11:
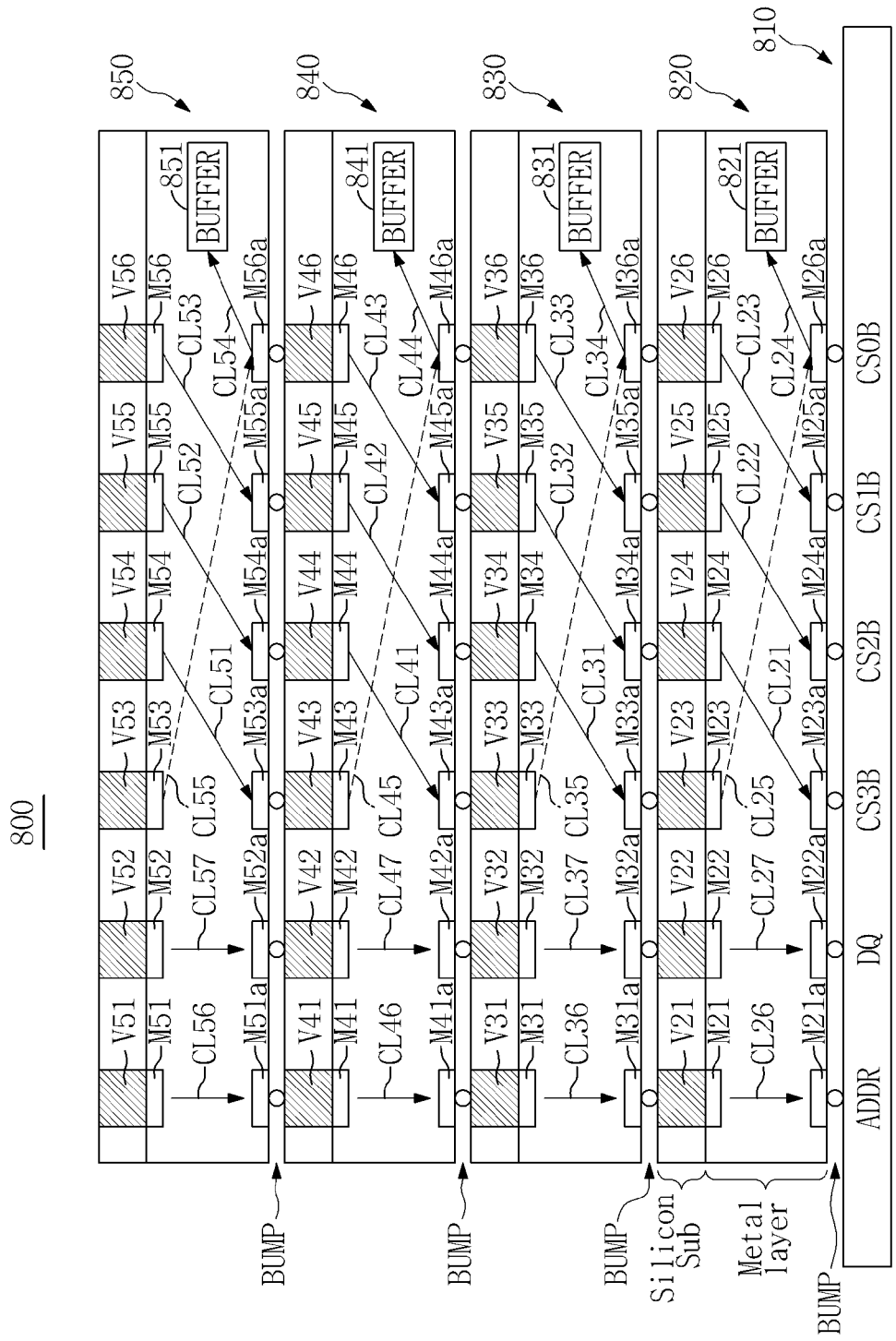
FIG. 11 is a cross-sectional view showing a stacked semiconductor memory device in accordance with an eighth embodiment of the inventive concepts.

FIG. 11 is a cross-sectional view showing a stacked semiconductor memory device 800 in accordance with an eighth embodiment of the inventive concept.

Referring to FIG. 11, the stacked semiconductor memory device 800 includes a processor chip 810 and memory chips 820, 830, 840, and 850 stacked above the processor chip 810. As shown in FIG. 11, the memory chips 820, 830, 840, and 850 respectively include a silicon substrate and a metal layer. The metal layer includes lower electrodes, upper electrodes, and connection lines. In FIG. 11, the connection lines are indicated by the arrows. In the stacked semiconductor memory device 800, a TSV is formed on the silicon substrate by using a via middle process for a connection between memory chips. When the via middle process is used, the TSV may be formed before the metal layer of the memory chips is formed.

TSVs V21, V22, V23, V24, V25, and V26 are located in the silicon substrate of the first memory chip 820. The metal layer of the first memory chip 820 includes lower electrodes M21, M22, M23, M24, M25, and M26, upper electrodes M21a, M22a, M23a, M24a, M25a, and M26a, and connection lines CL21 to CL26 which respectively electrically connect the lower electrodes M21, M22, M23, M24, M25, and M26 to the upper electrodes M21a, M22a, M23a, M24a, M25a, and M26a.

TSVs V31, V32, V33, V34, V35, and V36 are located in the silicon substrate of the second memory chip 830. The metal layer of the second memory chip 830 includes lower electrodes M31, M32, M33, M34, M35, and M36, upper electrodes M31a, M32a, M33a, M34a, M35a, and M36a, and connection lines CL31 to CL36 which respectively electrically connect the lower electrodes M31, M32, M33, M34, M35, and M36 to the upper electrodes M31a, M32a, M33a, M34a, M35a, and M36a.

TSVs V41, V42, V43, V44, V45, and V46 are located in the silicon substrate of the third memory chip 840. The metal layer of the third memory chip 840 includes lower electrodes M41, M42, M43, M44, M45, and M46, upper electrodes M41a, M42a, M43a, M44a, M45a, and M46a, and connection lines CL41 to CL46 which respectively electrically connect the lower electrodes M41, M42, M43, M44, M45, and M46 to the upper electrodes M41a, M42a, M43a, M44a, M45a, and M46a.

TSVs V51, V52, V53, V54, V55, and V56 are located in the silicon substrate of the fourth memory chip 850. The metal layer of the fourth memory chip 850 includes lower electrodes M51, M52, M53, M54, M55, and M56, upper electrodes M51a, M52a, M53a, M54a, M55a, and M56a, and connection lines CL51 to CL56 which respectively electrically connect the lower electrodes M51, M52, M53, M54, M55, and M56 to the upper electrodes M51a, M52a, M53a, M54a, M55a, and M56a.

Bumps are located between the processor chip 810 and the first memory chip 820, between the first memory chip 820 and the second memory chip 830, and between the second memory chip 830 and the third memory chip 840. The respective bumps electrically connect the semiconductor chips. The lower and upper electrodes respectively included in the memory chips 820, 830, 840, and 850 are respectively electrically connected to corresponding pads. Accordingly, the lower and upper electrodes respectively included in the memory chips 820, 830, 840, and 850 may be regarded as the respective corresponding pads.

An address signal ADDR and data DQ are transmitted from the processor chip 810 to the memory chips 820, 830, 840, and 850 through TSVs, lower electrodes, upper electrodes, and connection lines in the same positions of the memory chips 820, 830, 840, and 850.

For example, the address signal ADDR is transmitted from the processor chip 810 to the memory chips 820, 830, 840, and 850 through the first upper electrode M21a of the first memory chip 820, the connection line CL26, the first lower electrode M21 of the first memory chip 820, the first upper electrode M31a of the second memory chip 830, the connection line CL36, the first lower electrode M31 of the second memory chip 830, the first upper electrode M41a of the third memory chip 840, the connection line CL46, the lower electrode M41 of the third memory chip 840, the first upper electrode M51a of the fourth memory chip 850, the connection line CL56, and the first lower electrode M51 of the fourth memory chip 850.

The data DQ is transmitted from the processor chip 810 to the memory chips 820, 830, 840, and 850 through the second upper electrode M22a of the first memory chip 820, the connection line CL27, the second lower electrode M22 of the first memory chip 820, the second upper electrode M32a of the second memory chip 830, the connection line CL37, the second lower electrode M32 of the second memory chip 830, the second upper electrode M42a of the third memory chip 840, the connection line CL47, the second lower electrode M42 of the third memory chip 840, the second upper electrode M52a of the fourth memory chip 850, the connection line CL57, and the second lower electrode M52 of the fourth memory chip 850.

In terms of the chip selection signals CS0B, CS1B, CS2B, and CS3B, pads of different positions, not the same positions, are electrically connected to each other in the first memory chip 820 located on the lowest layer to the fourth memory chip 850 located on the highest layer.

For example, the fourth chip selection signal CS3B may be applied to the third upper electrode M23a of the first memory chip 820, the third chip selection signal CS2B may be applied to the fourth upper electrode M24a, the second chip selection signal CS1B may be applied to the fifth upper electrode M25a, and the first chip selection signal CS0B may be applied to the sixth upper electrode M26a.

The first upper electrode M23a of the first memory chip 820 is electrically connected to the fourth lower electrode M24 of the first memory chip 820 through the connection line CL21, and the fourth lower electrode M24 of the first memory chip 820 is electrically connected to the fourth upper electrode M34a of the second memory chip 830 through the TSV V24 and the bump. The fourth upper electrode M34a of the second memory chip 830 is electrically connected to the fifth lower electrode M35 of the second memory chip 830 through the connection line CL32, and the fifth lower electrode M35 of the second memory chip 830 is electrically connected to the fifth upper electrode M45a of the third memory chip 840 through the TSV V35 and the bump. The fifth upper electrode M45a of the third memory chip 840 is electrically connected to the sixth lower electrode M46 of the third memory chip 840 through the connection line CL43, and the sixth lower electrode M46 of the third memory chip 840 is electrically connected to the sixth upper electrode M56a of the fourth memory chip 850 through the TSV V46 and the bump. The sixth upper electrode M56a of the fourth memory chip 850 is electrically connected to the input buffer 751 through the connection line CL54.

Accordingly, the fourth chip selection signal CS3B is applied to the input buffer 851 included in the fourth memory chip 850 through the third upper electrode M23a of the first memory chip 820, the fourth lower electrode M24 of the first memory chip 820, the TSV V24, the fourth upper electrode M34a of the second memory chip 830, the fifth lower electrode M35 of the second memory chip 830, the TSV V35, the fifth upper electrode M45a of the third memory chip 840, the sixth lower electrode M46 of the third memory chip 840, the TSV V46, and the sixth upper electrode M56a of the fourth memory chip 850. Accordingly, the fourth memory chip 850 may be selected by the fourth chip selection signal CS3B.

The fourth upper electrode M24a of the first memory chip 820 is electrically connected to the fifth lower electrode M25 of the first memory chip 820 through the connection line CL22, and the fifth lower electrode M25 of the first memory chip 820 is electrically connected to the fifth upper electrode M35a of the second memory chip 830 through the TSV V25 and the bump. The fifth upper electrode M35a of the second memory chip 830 is electrically connected to the sixth lower electrode M36 of the second memory chip 830 through the connection line CL33, and the sixth lower electrode M36 of the second memory chip 830 is electrically connected to the sixth upper electrode M46a of the third memory chip 840 through the TSV V36 and the bump. The sixth upper electrode M46a of the third memory chip 840 is electrically connected to the input buffer 841 through the connection line CL44.

Accordingly, the third chip selection signal CS2B is applied to the input buffer 741 included in the third memory chip 840 through the fourth upper electrode M24a of the first memory chip 820, the fifth lower electrode M25 of the first memory chip 820, the TSV V25, the fifth upper electrode M35a of the second memory chip 830, the sixth lower electrode M36 of the second memory chip 830, the TSV V36, and the sixth upper electrode M46a of the third memory chip 840. Accordingly, the third memory chip 840 may be selected by the third chip selection signal CS2B.

The fifth upper electrode M25a of the first memory chip 820 is electrically connected to the sixth lower electrode M26 of the first memory chip 820 through the connection line CL23, and the sixth lower electrode M26 of the first memory chip 820 is electrically connected to the sixth upper electrode M36a of the second memory chip 830 through the TSV V26 and the bump. The sixth upper electrode M36a of the second memory chip 830 is electrically connected to the input buffer 831 through the connection line CL34.

Accordingly, the second chip selection signal CS1B is applied to the input buffer 831 included in the second memory chip 830 through the fifth upper electrode M25a of the first memory chip 820, the sixth lower electrode M26 of the first memory chip 820, the TSV V26, and the sixth upper electrode M36a of the second memory chip 830. Accordingly, the second memory chip 830 may be selected by the second chip selection signal CS1B.

The sixth upper electrode M26a of the first memory chip 820 is electrically connected to the input buffer 821 through the connection line CL24.

Accordingly, the first chip selection signal CS0B is applied to the input buffer 821 included in the first memory chip 820 through the sixth upper electrode M26a of the first memory chip 820. Accordingly, the first memory chip 820 may be selected by the first chip selection signal CS0B.

Referring to FIG. 11, the stacked semiconductor memory device 800 may automatically identify stacked memory chips without using a chip identification signal by asymmetrically connecting electrodes located in a path in which a chip selection signal is transmitted between the stacked memory chips as described above. As will be described later, the stacked semiconductor memory device 800 may compensate for a delay time between signals to be compared by matching impedances of transmission lines through which the chip selection signals CS0B, CS1B, CS2B, and CS3B are transmitted.

The stacked semiconductor memory device 800 shown in FIG. 11 matches impedances of chip transmission lines by utilizing unused electrodes and TSVs among the electrodes and TSVs prepared for chip selection signal transmission.

The first chip selection signal CS0B is used in the first memory chip 820, and is not used in the second memory chip 830, the third memory chip 840, or the fourth memory chip 850. It is necessary to compensate for a delay time of a path in which the first chip selection signal CS0B is transmitted so as to compare command signals with the first chip selection signal CS0B within the first memory chip 820 without error.

The upper electrode M26a of the first memory chip 820 to which the first chip selection signal CS0B is applied is electrically connected to the connection line CL25, the third lower electrode M23 of the first memory chip 820, the TSV V23, the third upper electrode M33a of the second memory chip 830, the connection line CL31, the fourth lower electrode M34 of the second memory chip 830, the TSV V34, the fourth upper electrode M44a of the third memory chip 840, the connection line CL42, the fifth lower electrode M45 of the third memory chip 840, the TSV V45, the fifth upper electrode M55a of the fourth memory chip 850, the connection line CL53, the sixth lower electrode M56 of the fourth memory chip 850, and the TSV V56.

The second chip selection signal CS1B is used in the second memory chip 830, and is not used in the third memory chip 840 or the fourth memory chip 850. It is necessary to compensate for a delay time of a path in which the second chip selection signal CS1B is transmitted so as to compare command signals with the second chip selection signal CS1B within the second memory chip 830 without error.

The sixth upper electrode M36a of the second memory chip 830 to which the second chip selection signal CS1B is applied is electrically connected to the connection line CL35, the third lower electrode M33 of the second memory chip 830, the TSV V33, the third upper electrode M43a of the third memory chip 830, the connection line CL41, the fourth lower electrode M44 of the third memory chip 840, the TSV V44, the fourth upper electrode M54a of the fourth memory chip 850, the connection line CL52, the fifth lower electrode M55 of the fourth memory chip 850, and the TSV V55.

The third chip selection signal CS2B is used in the third memory chip 840, and is not used in the fourth memory chip 850. It is necessary to compensate for a delay time of a path in which the third chip selection signal CS2B is transmitted so as to compare command signals with the third chip selection signal CS2B within the third memory chip 840 without error.

The sixth upper electrode M46a of the third memory chip 840 to which the third chip selection signal CS2B is applied is electrically connected to the connection line CL45, the third lower electrode M43 of the third memory chip 840, the TSV V43, the third upper electrode M53a of the fourth memory chip 850, the connection line CL51, the fourth lower electrode M54 of the fourth memory chip 850 and the TSV V54.

The fourth chip selection signal CS3B is used in the fourth memory chip 850. It is necessary to compensate for a delay time of a path in which the fourth chip selection signal CS3B is transmitted so as to compare command signals with the fourth chip selection signal CS3B within the fourth memory chip 850 without error.

The sixth upper electrode M56a of the fourth memory chip 850 to which the fourth chip selection signal CS3B is applied is electrically connected to the connection line CL55, the third lower electrode M53 of the fourth memory chip 850, and the TSV V53.

Figure 12:
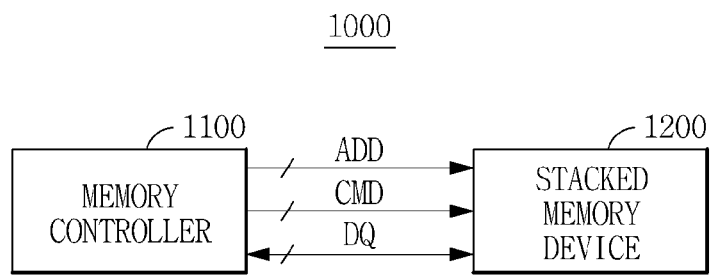
FIG. 12 is a block diagram showing an example of a memory system including a stacked semiconductor memory device in accordance with embodiments of the inventive concepts.

FIG. 12 is a block diagram showing an example of a memory system including the stacked semiconductor memory devices in accordance with embodiments of the inventive concept.

Referring to FIG. 12, a memory system 1000 includes a memory controller 1100 and a stacked semiconductor memory device 1200.

The memory controller 1100 generates an address signal ADD and a command CMD, and provides the address signal ADD and the command CMD to the stacked semiconductor memory device 1200 through buses. Data DQ is transmitted from the memory controller 1100 to the stacked semiconductor memory device 1200 through a bus, or is transmitted from the stacked resistive memory device 1200 to the memory controller 1100 through a bus.

If the stacked semiconductor memory device 1200 should compare a first signal transmitted through a first transmission line electrically coupled to a TSV with a second signal transmitted through a second transmission line not electrically coupled to a TSV on one memory chip, a dummy TSV having the same impedance as the TSV is electrically coupled to the second transmission line. Accordingly, since impedances of the first and second transmission lines are matched, it is possible to compensate for a delay time of the second signal transmitted through the second transmission line and compare the first signal with the second signal without error.

Accordingly, even with an increase in the number of stacked memory chips, the stacked semiconductor memory device may precisely compensate for a delay time and a product may be relatively easily designed in accordance with embodiments of the inventive concepts. The stacked semiconductor memory device in the above example includes two or four stacked memory chips, although it will be understood that a stacked semiconductor memory device in accordance with embodiments of the inventive concepts may include an arbitrary number of memory chips.

Figure 13:
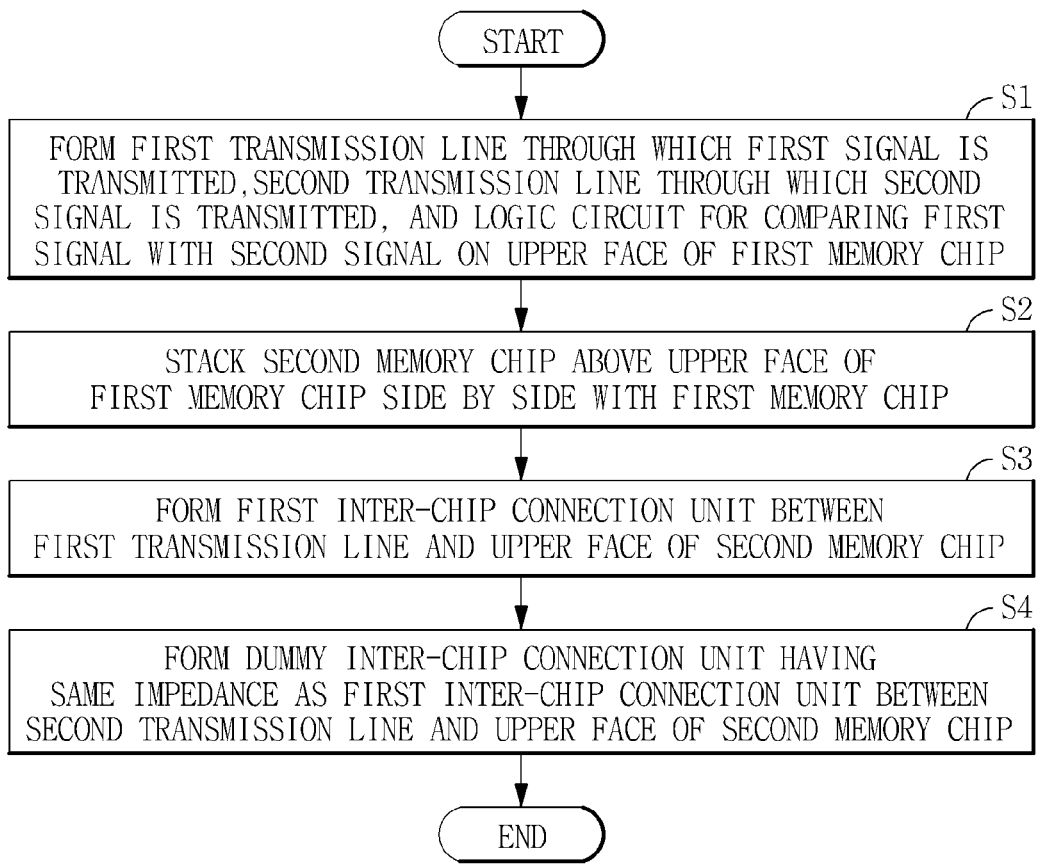
FIG. 13 is a flowchart for use in describing a method of manufacturing a stacked memory device in accordance with embodiments of the inventive concepts.

FIG. 13 is a flowchart for use in describing a method of manufacturing a stacked semiconductor memory device in accordance with embodiments of the inventive concepts.

Referring to FIG. 13, a method of manufacturing a stacked semiconductor memory device in accordance with embodiments of the inventive concepts is described below.

A first transmission line through which a first signal is transmitted, a second transmission line through which a second signal is transmitted, and a logic circuit which compares the first signal with the second signal are formed on an upper face of a first memory chip (S1). A second memory chip is arranged so as to be stacked above an upper face of the first memory chip (S2). A first inter-chip connection unit is formed between the first transmission line and an upper face of the second memory chip (S3). A dummy inter-chip connection unit having the same impedance as the first inter-chip connection unit is formed between the second transmission line and the upper face of the second memory chip (S4). The inter-chip connection unit(s) may be a TSV.

Figure 14:
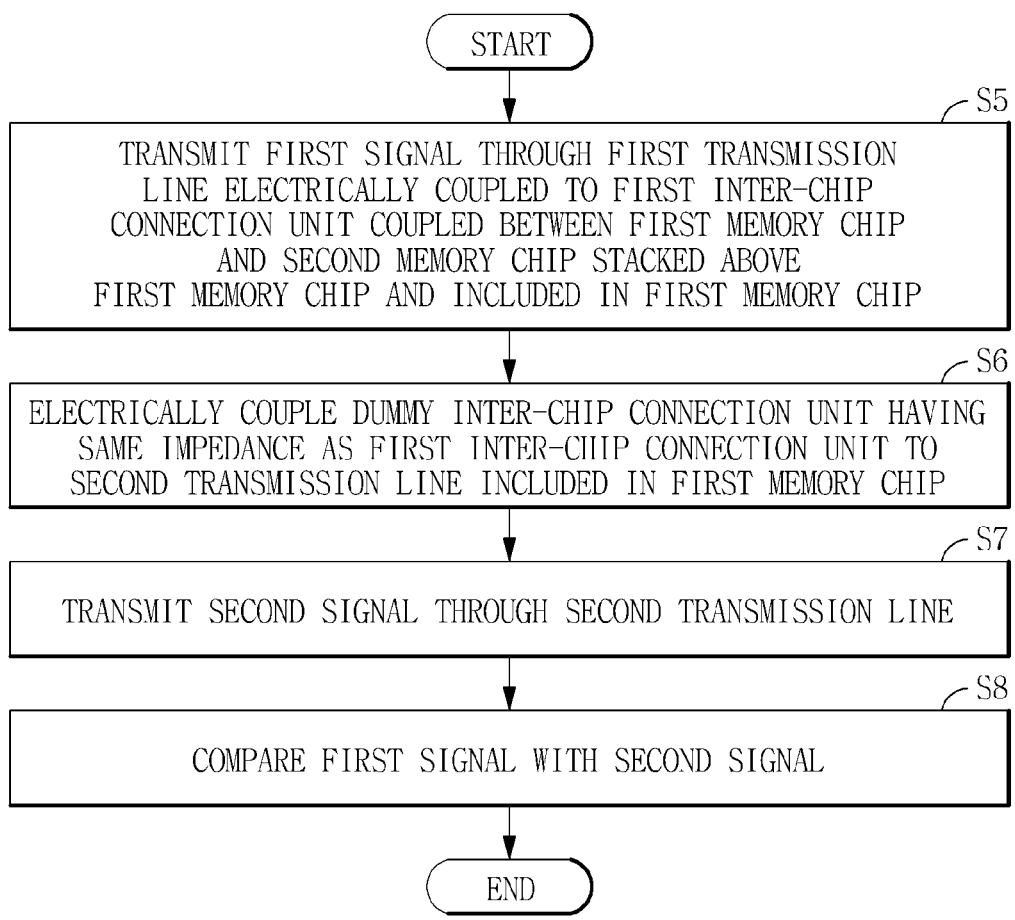
FIG. 14 is a flowchart for use in describing a method of compensating for a difference in transmission times in a stacked semiconductor memory device in accordance with embodiments of the inventive concepts.

FIG. 14 is a flowchart showing a method of compensating for a difference in transmission times in a stacked semiconductor memory device in accordance with embodiments of the inventive concepts.

Referring to FIG. 14, the method of compensating for a different in transmission times in a stacked semiconductor memory device in accordance with embodiments of the inventive concept is described below.

A first signal is transmitted through a first transmission line which is electrically connected to a first inter-chip connection unit coupled between a first memory chip and a second memory chip stacked above the first memory chip and is included in the first memory chip (S5). A dummy inter-chip connection unit having the same impedance as the first inter-chip connection unit is electrically coupled to a second transmission line included in the first memory chip (S6). A second signal is transmitted through the second transmission line (S7). The first signal is compared with the second signal (S8).

Embodiments of the inventive concepts are applicable to semiconductor memory devices, and are applicable to stacked semiconductor memory devices.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of the inventive concepts as defined in the claims. In the claims, means-plus-function clauses (if any) are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A stacked semiconductor memory device comprising:
   a first memory chip including a first transmission line, a second transmission line, and a logic circuit configured to execute a logic operation on a first signal of the first transmission line and a second signal of the second transmission line;
   a second memory chip stacked over the first memory chip;
   an inter-chip connection unit electrically coupled between the second memory chip and the first transmission line of the first memory chip; and
   a dummy inter-chip connection unit electrically coupled to the second transmission line of the first memory chip and electrically isolated from the second memory chip.

2. The stacked semiconductor memory device according to claim 1, wherein an impedance of the dummy inter-chip connection unit matches an impedance of the inter-chip connection unit.

3. The stacked semiconductor memory device according to claim 1, wherein a transmission time of the second signal transmitted through the second transmission line is the same as a transmission time of the first signal transmitted through the first transmission line.

4. The stacked semiconductor memory device according to claim 1, wherein each of the inter-chip connection unit and the dummy inter-chip connection unit is a through silicon via (TSV).

5. The stacked semiconductor memory device according to claim 1, wherein the logic circuit comprises a flip-flop.

6. The stacked semiconductor memory device according to claim 1, wherein the first signal is a command signal, and the second signal is a chip selection signal.

7. The stacked semiconductor memory device according to claim 1, wherein the first signal is a command signal, and the second signal is an on-die termination control signal.

8. The stacked semiconductor memory device according to claim 1, which comprises a delay locked loop only in the first memory chip among the first and second memory chips.

9. The stacked semiconductor memory device according to claim 8, wherein the second transmission line is a command path of the first memory chip, wherein the first transmission line is connected to a flip-flop data terminal of the first memory chip, and wherein the inter-chip connection unit is electrically coupled between the first transmission line and a data path of the second memory chip.

10. The stacked semiconductor memory device according to claim 9, wherein a time in which data output from the second memory chip reaches the flip-flop of the first memory chip is the same as a time in which a command signal reaches the first memory chip.

11. The stacked semiconductor memory device according to claim 1, wherein a delay locked loop and a replica circuit are included in each of stacked first and second memory chips.

12. The stacked semiconductor memory device according to claim 11, wherein the dummy inter-chip connection unit has a same impedance the inter-chip connection unit included in a data path from the second memory chip to a delay unit of the first memory chip, and is electrically coupled to a transmission path of the replica circuit included in each of the first and second memory chips.

13. The stacked semiconductor memory device according to claim 11, wherein the dummy inter-chip connection unit has a same impedance as the inter-chip connection unit included in a path through which a clock signal is transmitted, and is electrically coupled to a transmission path of the replica circuit included in each of the first and second memory chips.

14. The stacked semiconductor memory device according to claim 11, wherein replica circuits included in each of the stacked memory chips use delay units included in the first memory chip.

15. A stacked semiconductor memory device comprising:
a plurality of stacked memory chips each including k lower electrodes, k upper electrodes, and k through silicon vias (TSVs), where k is a positive integer of 2 or more, and wherein respective positions of the k lower electrodes, k upper electrodes and k TSVs are the same within the plurality of stacked memory chips;
wherein a $k^{th}$ upper electrode of a first memory chip among the plurality of stacked memory chips to which a chip selection signal is applied is electrically connected to a $k+1^{th}$ upper electrode of a second memory chip stacked above the first memory chip.

16. The stacked semiconductor memory device according to claim 15, wherein the $k^{th}$ upper electrode of the first memory chip is electrically connected to the $k+1^{th}$ upper electrode of the second memory chip through a $k+1^{th}$ lower electrode and a $k+1^{th}$ TSV of the first memory chip.

17. The stacked semiconductor memory device according to claim 16, wherein the $k^{th}$ upper electrode of the first memory chip is electrically connected to the $k+1^{th}$ lower electrode of the first memory chip through a connection line of the first memory chip.

18. The stacked semiconductor memory device according to claim 15, wherein all paths through which chip selection signals for selecting each of the memory chips are transmitted extend to highest memory chip among the plurality of stacked memory chips.

19. The stacked semiconductor memory device according to claim 18, wherein all the paths through which the chip selection signals for selecting each of the memory chips are transmitted have a same impedance.

20. A stacked semiconductor memory device comprising:
a plurality of stacked memory chips each including k lower electrodes, k upper electrodes, and k through silicon vias (TSVs), where k is a positive integer of 2 or more, and wherein respective positions of the k lower electrodes, k upper electrodes and k TSVs are the same within the plurality of stacked memory chips;
wherein a $k^{th}$ upper electrode of a first memory chip among the plurality of stacked memory chips to which a chip selection signal is applied is electrically connected to a $k+1^{th}$ upper electrode of a second memory chip stacked above the first memory chip, and
wherein an upper rightmost electrode of the first memory chip for transmitting the chip selection signal is electrically connected to an upper leftmost electrode of the second memory chip for transmitting the chip selection signal.

21. The stacked semiconductor memory device according to claim 20, wherein a first bit of the chip selection signal is applied to the upper rightmost electrode of the first memory chip, and a last bit of the chip selection signal is applied to an upper leftmost electrode of the first memory chip.

22. The stacked semiconductor memory device according to claim 20, wherein all paths through which chip selection signals for selecting each of the memory chips are transmitted have a same impedance.

23. A memory system comprising:
a memory controller configured to generate an address signal and a command signal; and
a stacked semiconductor memory device configured to store received data and to output stored data in accordance with the address signal and the command signal,
wherein the stacked semiconductor memory device comprises:
a first memory chip including a first transmission line, a second transmission line, and a logic circuit configured to execute a logic operation on a first signal of the first transmission line and a second signal of the second transmission line;
a second memory chip stacked over the first memory chip;
an inter-chip connection unit electrically coupled between the second memory chip and the first transmission line of the first memory chip; and
a dummy inter-chip connection unit electrically coupled to the second transmission line of the first memory chip and electrically isolated from the second memory chip.

\* \* \* \* \*